(12) United States Patent
Jo et al.

(10) Patent No.: US 11,309,361 B2
(45) Date of Patent: Apr. 19, 2022

(54) DISPLAY DEVICE HAVING REDUCED MIXTURE OF COLORS BETWEEN NEIGHBORING PIXELS

(71) Applicant: SAMSUNG DISPLAY CO., LTD., Yongin-si (KR)

(72) Inventors: Kang Moon Jo, Hwaseong-si (KR); Dong Woo Kim, Yongin-si (KR); Sung Jae Moon, Seongnam-si (KR); Jun Hyun Park, Suwon-si (KR); An Su Lee, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 85 days.

(21) Appl. No.: 16/725,248

(22) Filed: Dec. 23, 2019

(65) Prior Publication Data

US 2020/0219939 A1 Jul. 9, 2020

(30) Foreign Application Priority Data

Jan. 7, 2019 (KR) .................. 10-2019-0001815

(51) Int. Cl.
*H01L 29/08* (2006.01)
*H01L 27/32* (2006.01)

(52) U.S. Cl.
CPC ........ *H01L 27/322* (2013.01); *H01L 27/3262* (2013.01); *H01L 27/3265* (2013.01)

(58) Field of Classification Search
CPC ................. H01L 27/3262; H01L 27/3265
See application file for complete search history.

(56) References Cited

U.S. PATENT DOCUMENTS

| 2017/0343853 | A1* | 11/2017 | Lee | ............... H01L 27/124 |
| 2018/0006093 | A1* | 1/2018 | Kim | ............... H01L 33/06 |
| 2018/0364521 | A1* | 12/2018 | Baek | ............... G02B 5/3058 |

FOREIGN PATENT DOCUMENTS

| KR | 10-1661541 | 9/2016 |
| KR | 10-1663564 | 9/2016 |
| KR | 10-2018-0024910 | 3/2018 |
| KR | 10-2018-0035286 | 4/2018 |
| KR | 10-2018-0093001 | 8/2018 |

* cited by examiner

*Primary Examiner* — Phuc T Dang
(74) *Attorney, Agent, or Firm* — F. Chau & Associates, LLC

(57) ABSTRACT

A display device includes a substrate including a plurality of light-emitting devices, a first color filter, a second color filter, and a third color filter that overlap one of the light-emitting devices, and a first color converting layer that overlaps the first color filter, a second color converting layer that overlaps the second color filter, and a transmission layer that overlaps the third color filter. A plurality of the first color filters, a plurality of the second color filters, and a plurality of the third color filters are arranged in a first direction. A gap between adjacent second color filters in a second direction overlaps the first color filter in the first direction.

18 Claims, 10 Drawing Sheets

DISPLAY DEVICE HAVING REDUCED MIXTURE OF COLORS BETWEEN NEIGHBORING PIXELS

CROSS-REFERENCE TO RELATED APPLICATIONS

This application claims priority under 35 U.S.C. § 119 to Korean Patent Application No. 10-2019-0001815 filed in the Korean Intellectual Property Office on Jan. 7, 2019, the disclosure of which is incorporated by reference herein in its entirety.

TECHNICAL FIELD

Exemplary embodiments of the present invention relate to a display device, and more particularly, to a display device for reducing mixture of colors between neighboring pixels.

DISCUSSION OF THE RELATED ART

A display device is a device for displaying images. A light-emitting diode display, such as an organic light-emitting diode (OLED) display, is a self-emissive display device that is commonly used.

A light-emitting diode display has a self-emission characteristic. As a result, unlike liquid crystal display devices, a light-emitting diode display requires no additional light source, thereby reducing the thickness and weight thereof. Further, a light-emitting diode display has high-quality characteristics such as low power consumption, high luminance, and high refresh rate.

In general, a light-emitting diode display includes a substrate, a plurality of thin film transistors disposed on the substrate, a plurality of insulating layers disposed among wires configuring the thin film transistors, and a light-emitting device connected to the thin film transistors. The light-emitting device may be, for example, an organic light emitting element.

A plurality of light-emitting devices are separated from each other by a predetermined distance. Mixture of colors may occur among neighboring light-emitting devices, thus, decreasing the display quality.

SUMMARY

Exemplary embodiments of the present invention provide a display device for improving mixture of colors.

According to an exemplary embodiment, a display device includes a substrate including a plurality of light-emitting devices, a first color filter, a second color filter, and a third color filter that overlap one of the light-emitting devices, and a first color converting layer that overlaps the first color filter, a second color converting layer that overlaps the second color filter, and a transmission layer that overlaps the third color filter. A plurality of the first color filters, a plurality of the second color filters, and a plurality of the third color filters are arranged in a first direction. A gap between adjacent second color filters in the second direction overlaps the first color filter in the first direction.

In an exemplary embodiment, in the first direction, a gap between adjacent first color filters in the second direction overlaps a gap between adjacent third color filters in the second direction.

In an exemplary embodiment, the first color filter is a red color filter, the second color filter is a green color filter, and the third color filter is a blue color filter.

In an exemplary embodiment, the one of the light-emitting devices corresponds to one pixel, and the one pixel comprises three transistors and one capacitor.

In an exemplary embodiment, the plurality of light-emitting devices emit blue light.

In an exemplary embodiment, a region of the first color filter overlapping the gap between adjacent second color filters in the second direction is about 10% to about 50% of a length of the overlapping first color filter in the second direction.

In an exemplary embodiment, the second color filter overlaps a light emitting element layer and the second color converting layer in a direction perpendicular to the substrate.

In an exemplary embodiment, an area of the first color filter is greater than an area of the second color filter, and the area of the second color filter is greater than an area of the third color filter.

In an exemplary embodiment, an area of the second color filter is greater than an area of the first color filter, and the area of the first color filter is greater than an area of the third color filter.

According to an exemplary embodiment, a display device includes a substrate including a plurality of light-emitting devices, a first color filter, a second color filter, and a third color filter that overlap one of the light-emitting devices, and a first color converting layer that overlaps the first color filter, a second color converting layer that overlaps the second color filter, and a transmission layer that overlaps the third color filter. A plurality of the first color filters, a plurality of the second color filters, and a plurality of the third color filters are arranged in a first direction. A gap between adjacent second color filters in the second direction overlaps the first color filter and the third color filter in the first direction. A gap between adjacent third color filters in the second direction overlaps the first color filter and the second color filter in the first direction. A gap between adjacent first color filters in the second direction overlaps the second color filter and the third color filter in the first direction.

In an exemplary embodiment, the first color filter is a red color filter, the second color filter is a green color filter, and the third color filter is a blue color filter.

In an exemplary embodiment, the one of the light-emitting devices corresponds to one pixel, and the one pixel includes three transistors and one capacitor.

In an exemplary embodiment, the plurality of light-emitting devices emit blue light.

In an exemplary embodiment, a region of the first color filter overlapping the gap between adjacent second color filters in the second direction is about 10% to about 50% of a length of the overlapping first color filter in the second direction.

In an exemplary embodiment, a region of the first color filter overlapping the gap between adjacent third color filters in the second direction is about 10% to about 50% of a length of the overlapping first color filter in the second direction.

In an exemplary embodiment, the first color filter overlaps a light emitting element layer and the first color converting layer in a direction perpendicular to the substrate, the second color filter overlaps the light emitting element layer and the second color converting layer in the direction perpendicular to the substrate, and the third color filter overlaps the light emitting element layer and the transmission layer in the direction perpendicular to the substrate.

In an exemplary embodiment, an area of the first color filter is greater than an area of the second color filter, and the area of the second color filter is greater than an area of the third color filter.

In an exemplary embodiment, an area of the second color filter is greater than an area of the first color filter, and the area of the first color filter is greater than a area of the third color filter.

According to an exemplary embodiment, a display device includes a substrate including a plurality of light-emitting devices, a first color filter, a second color filter, and a third color filter that overlap one of the light-emitting devices, and a first color converting layer that overlaps the first color filter, a second color converting layer that overlaps the second color filter, and a transmission layer that overlaps the third color filter. A plurality of the first color filters, a plurality of the second color filters, and a plurality of the third color filters are arranged in a first direction. An upper edge of the first color filter is aligned with an upper edge of the third color filter and is not aligned with an upper edge of the second color filter in the first direction. A lower edge of the first color filter is aligned with a lower edge of the third color filter and is not aligned with a lower edge of the second color filter in the first direction.

In an exemplary embodiment, the first color filter is a red color filter, the second color filter is a green color filter, and the third color filter is a blue color filter.

BRIEF DESCRIPTION OF THE DRAWINGS

The above and other features of the present invention will become more apparent by describing in detail exemplary embodiments thereof with reference to the accompanying drawings, in which.

DETAILED DESCRIPTION

Figure 1:
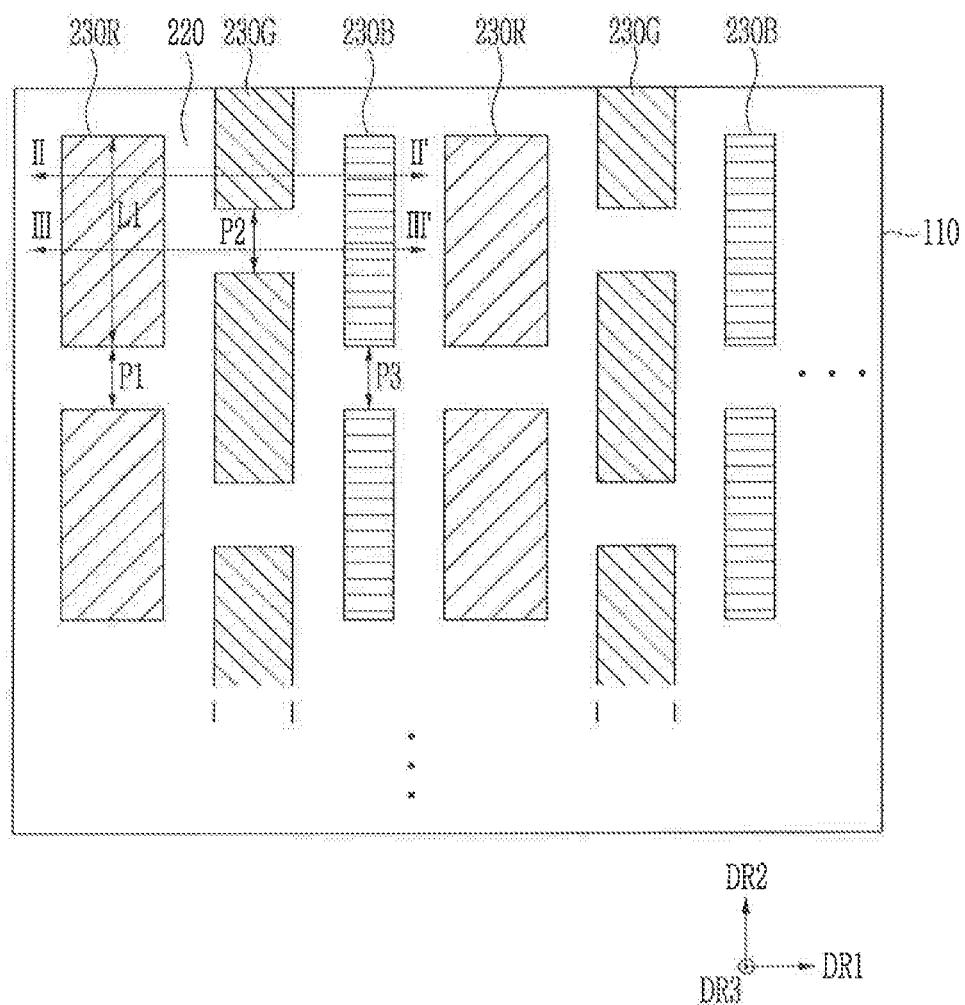
FIG. 1 shows a display device according to an exemplary embodiment of the present invention.

Exemplary embodiments of the present invention will be described more fully hereinafter with reference to the accompanying drawings. Like reference numerals may refer to like elements throughout the accompanying drawings.

It will be understood that when a component, such as a film, a region, a layer, or an element, is referred to as being "on", "connected to", "coupled to", or "adjacent to" another component, it can be directly on, connected, coupled, or adjacent to the other component, or intervening components may be present. It will also be understood that when a component is referred to as being "between" two components, it can be the only component between the two components, or one or more intervening components may also be present. It will also be understood that when a component is referred to as "covering" another component, it can be the only component covering the other component, or one or more intervening components may also be covering the other component. Other words use to describe the relationship between elements should be interpreted in a like fashion.

Spatially relative terms, such as "beneath", "below", "lower", "under", "above", "upper", etc., may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below.

It will be understood that the terms "first," "second," "third," etc. are used herein to distinguish one element from another, and the elements are not limited by these terms. Thus, a "first" element in an exemplary embodiment may be described as a "second" element in another exemplary embodiment.

It should be understood that descriptions of features or aspects within each exemplary embodiment should typically be considered as available for other similar features or aspects in other exemplary embodiments, unless the context clearly indicates otherwise.

As used herein, the singular forms "a", "an" and "the" are intended to include the plural forms as well, unless the context clearly indicates otherwise.

The terms "about" or "approximately" as used herein are inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations as understood by one of the ordinary skill in the art. Further, it is to be understood that while parameters may be described herein as having "about" a certain value, according to exemplary embodiments, the parameter may be exactly the certain value or approximately the certain value within a measurement error as would be understood by a person having ordinary skill in the art.

Herein, a plane view represents a view for observing a side that is parallel to two directions (e.g., a first direction (DR1) and a second direction (DR2)) crossing each other, and a cross-sectional view represents a view for observing a side that is cut in a direction (e.g., a third direction (DR3)) that is perpendicular to a side that is parallel to the first direction (DR1) and the second direction (DR2). When two constituent elements overlap each other, it means that the two constituent elements overlap each other in the third direction (DR3), for example, in the direction that is perpendicular to an upper side of a substrate, unless the context clearly indicates otherwise.

A display device according to an exemplary embodiment of the present invention will now be described with reference to the accompanying drawings.

FIG. 1 shows a display device according to an exemplary embodiment of the present invention.

Referring to FIG. 1, in an exemplary embodiment, the display device includes a plurality of pixels and a plurality of color filters 230R, 230G, and 230B disposed on a first substrate 110. The color filters 230 include a first color filter 230R, a second color filter 230G, and a third color filter 230B. A light blocking member 220 is disposed among the color filters 230R, 230G, and 230B.

The first color filter 230R is one of a plurality of first color filters 230R. The first color filters 230R are separated from each other in a second direction DR2. For example, the first color filters 230R are disposed adjacent to each other in the second direction DR2.

The second color filter 230G is one of a plurality of second color filters 230G. The second color filters 230G are separated from each other in the second direction DR2. For example, the second color filters 230G are disposed adjacent to each other in the second direction DR2.

The third color filter 230B is one of a plurality of third color filters 230B. The third color filters 230B are separated from each other in the second direction DR2. For example, the third color filters 230B are disposed adjacent to each other in the second direction DR2.

The first color filters 230R, the second color filters 230G, and the third color filters 230B are arranged in the first direction DR1. For example, the first color filters 230R, the second color filters 230G, and the third color filters 230B are alternately disposed in the first direction DR1. As shown in FIG. 1, a first gap P1 in the second direction DR2 between adjacent first color filters 230R does not neighbor a second gap P2 in the second direction DR2 between adjacent second color filters 230G in the first direction DR1. For example, the first gap P1 is not aligned with the second gap P2 in the first direction DR1. For example, an upper boundary of the first gap P1 is not aligned with an upper boundary of the second gap P2 in the first direction DR1, and a lower boundary of the first gap P1 is not aligned with a lower boundary of the second gap P2 in the first direction DR1.

Similarly, the second gap P2 in the second direction DR2 between adjacent second color filters 230G does not neighbor a third gap P3 in the second direction between adjacent third color filters 230B in the first direction DR1. For example, the second gap P2 is not aligned with the third gap P3 in the first direction DR1. For example, the upper boundary of the second gap P2 is not aligned with an upper boundary of the third gap P3 in the first direction DR1, and the lower boundary of the second gap P2 is not aligned with a lower boundary of the third gap P3 in the first direction DR1.

The first gap P1 between adjacent first color filters 230R may be aligned with the third gap P3 in the first direction DR1. For example, the upper boundary of the first gap P1 may be aligned with the upper boundary of the third gap P3 in the first direction DR1, and the lower boundary of the first gap P1 may be aligned with the lower boundary of the third gap P3 in the first direction DR1.

Thus, referring to FIG. 1, the first color filter 230R and the third color filter 230B are aligned with each other in the first direction DR1, and the second color filter 230G and the neighboring color filters 230R and 230B are alternately disposed (e.g., the second color filter 230G is not aligned with the neighboring color filters 230R and 230B). For example, the first color filter 230R and the third color filter 230B may be aligned with each other in the first direction DR1, and the second color filter 230G disposed therebetween may be relatively staggered (e.g., not aligned with the first color filter 230R and the third color filter 230B) in the first direction DR1. For example, an upper edge of the first color filter 230R, which extends in the first direction DR1, is aligned with an upper edge of the third color filter 230B and is not aligned with an upper edge of the second color filter 230G in the first direction DR1, and a lower edge of the first color filter 230R, which extends in the first direction DR1, is aligned with a lower edge of the third color filter 230B and is not aligned with a lower edge of the second color filter 230G in the first direction DR1. This pattern may be repeated for the plurality of first color filters 230R, second color filters 230G, and third color filters 230B. As a result of this arrangement, mixture of colors among neighboring pixels may be reduced, thus improving display quality, as described further below.

In FIG. 1, part of a first length L1 in the second direction DR2 of the first color filter 230R overlaps the second gap P2 of the second color filter 230G in the first direction DR1. For example, the second gap P2 between adjacent second color filters 230G in the first direction DR1 may overlap (e.g., be aligned with) a portion of a neighboring first color filter 230R. As a result, mixture of colors with neighboring pixels by an overlapping region may be prevented or reduced.

When the color filters 230R, 230G, and 230B are arranged in parallel and are aligned with each other, the first length L1 is parallel with the neighboring pixels. However, when the color filters 230R, 230G, and 230B are arranged alternately as shown in FIG. 1 (e.g., when at least one of the color filters 230R, 230G, and 230B is staggered relative to the other color filters), a region excluding the second gap P2 from among the first length L1 is aligned with the neighboring pixels. As a result, the region in which mixture of colors is generated may be reduced. When a length of one pixel is defined to be a sum of the first length L1 and the first gap P1, a reduction rate of mixture of colors of a display device according to an exemplary embodiment may be defined to be $1-((L1-P1)/L1)$.

For example, regarding the display device with a ratio of the first length L1 of the first color filter 230R and the first gap P1 of 3:1, when the second color filters 230G are alternately arranged as shown in FIG. 1, the region in which a mixture of colors is generated is reduced by about 33% compared to the case in which all of the color filters are aligned with each other.

For example, the region overlapping the first gap P2 of the second color filter 230G from among the first length L1 of the first color filter 230R may be about 10% to about 50%.

As will be described in further detail below, the transistors of the pixels corresponding to the first color filter 230R, the second color filter 230G, and the third color filter 230B are not alternately arranged like the color filters, but rather, are uniformly arranged. That is, in FIG. 1, the second color filters 230G and the neighboring color filters are alternately disposed, and the arrangement of the transistors including a gate line and a data line at a bottom of the second color filter 230G may be identical with that of the neighboring pixels (e.g., the pixel corresponding to the first color filter 230R).

However, the color filters 230R, 230G, and 230B may overlap a light-emitting device.

In an exemplary embodiment, the light-emitting device includes a first electrode, a light emitting element layer, and a second electrode, and the second color filter 230G and the light-emitting device may overlap each other, so that respective electrodes disposed on a same column as the second color filter 230G may also be alternately disposed with the pixels in the neighboring column. A detailed arrangement of the light-emitting device will be described below.

Referring to FIG. 1, a planar area of the first color filter 230R may be greater than that of the second color filter 230G, and a planar area of the second color filter 230G may be greater than that of the third color filter 230B. Here, the first color filter 230R may be a red color filter, the second color filter 230G may be a green color filter, and the third color filter 230B may be a blue color filter. However, the present invention is not limited thereto.

In an exemplary embodiment, the second color filter 230G may be the largest of the first color filter 230R, the second color filter 230G, and the third color filter 230B, and the third color filter 230B may be the smallest of the first color filter 230R, the second color filter 230G, and the third color filter 230B.

FIG. 1 shows the first substrate 110, the first color filter 230R, the second color filter 230G, and the third color filter 230B. The display device shown in FIG. 1 may include color converting layers overlapping the respective color filters. The color filters 230R, 230G, and 230B may respectively correspond to one pixel, and each pixel may include three transistors and one capacitor. A detailed configuration will be described below.

Figure 2:
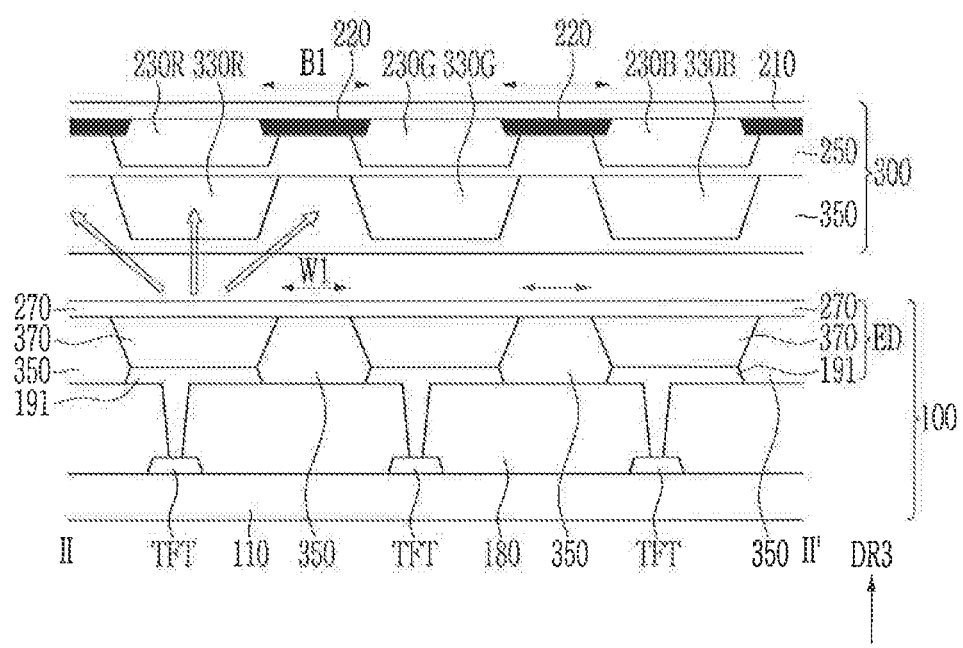
FIG. 2 shows a cross-sectional view taken along line II-II' of FIG. 1.

FIG. 2 shows a cross-sectional view taken along line II-II" of FIG. 1.

Referring to FIG. 2, the display device according to an exemplary embodiment includes a display substrate 100 and a color converting substrate 300.

The display substrate 100 includes a first substrate 110, a plurality of transistors TFT disposed on the first substrate 110, and an insulating layer 180. A first electrode 191 and a partition wall 350 are disposed on the insulating layer 180, and the first electrode 191 is disposed in an opening of the partition wall 350 and is connected to the transistor TFT. A second electrode 270 is disposed on the partition wall 350, and a light emitting element layer 370 is disposed between the first electrode 191 and the second electrode 270. The first electrode 191, the second electrode 270, and the light emitting element layer 370 may be collectively referred to as a light-emitting device ED.

A light blocking member 220 is disposed on a second substrate 210. The light blocking member 220 may overlap the partition wall 350 of the first substrate 110. For example, the light blocking member 220 and the partition wall 350 may be aligned with each other in a third direction DR3.

The color filters 230R, 230G, and 230B are disposed between the light blocking members 220. For example, as shown in FIG. 2, a light blocking member 220 may be disposed between adjacent color filters 230R and 230G, and another light blocking member 220 may be disposed between adjacent color filters 230G and 230B.

A color filter insulating layer 250 is disposed on the color filter 230 and the light blocking member 220. Color converting layers 330R and 330G and a transmission layer 330B are disposed on the color filter insulating layer 250. That is, the color filter insulating layer 250 is disposed among the color converting layers 330R and 330G, and the transmission layer 330B and the color filters 230R, 230G, and 230B. The color converting layers 330R and 330G and the transmission layer 330B may overlap the respective color filters 230R, 230G, and 230B. For example, the color converting layer 330R may be aligned with the first color filter 230R in the third direction DR3, the color converting layer 330G may be aligned with the second color filter 230G in the third direction DR3, and the transmission layer 330B may be aligned with the third color filter 230B in the third direction DR3.

The color converting layers 330R and 330G include quantum dots, and convert incident light into another color. The color converting layers 330R and 330G include a red color converting layer 330R and a green color converting layer 330G, and convert blue light emitted by the light emitting element layer 370 into red and green light, respectively. The transmission layer 330B may transmit the blue light.

A planarization film, which may correspond to the partition wall 350, may be disposed on the color converting layers 330R and 330G and the transmission layer 330B.

That is, the display device includes a display substrate 100 and a color converting substrate 300, and the light emitted by the display substrate 100 passes through the color converting layers 330R and 330G or the transmission layer 330B of the color converting substrate 300, passes through the color filters 230R, 230G, and 230B, and is then discharged to the outside.

In this instance, the light emitted by the light emitting element layer 370 is discharged in many directions. As a result, this light may be input to the color converting layers 330R and 330G or the transmission layer 330B of the neighboring pixel (i.e., an unintended pixel) instead of the color converting layers 330R and 330G or the transmission layer 330B overlapping the light emitting element layer 370 (i.e., an intended pixel). This causes a mixture of colors, which may decrease display quality. The mixture of colors is shown by arrows in FIG. 2.

As shown in FIG. 2, the mixture of colors is greater as a length B1 of the light blocking member 220 or a length W1 of the partition wall 350 is reduced. However, to manufacture the display device with high quality and high resolution, the region of the light blocking member between neighboring color filters may not be increased. This is because an aperture ratio is reduced when the width B1 of the light blocking member 220 is increased.

However, according to exemplary embodiments, by alternately arranging the second color filter 230G and the neighboring color filters 230R and 230B without increasing the width B1 of the light blocking member 220, the mixture of colors occurring in the display device may be reduced.

Figure 3:
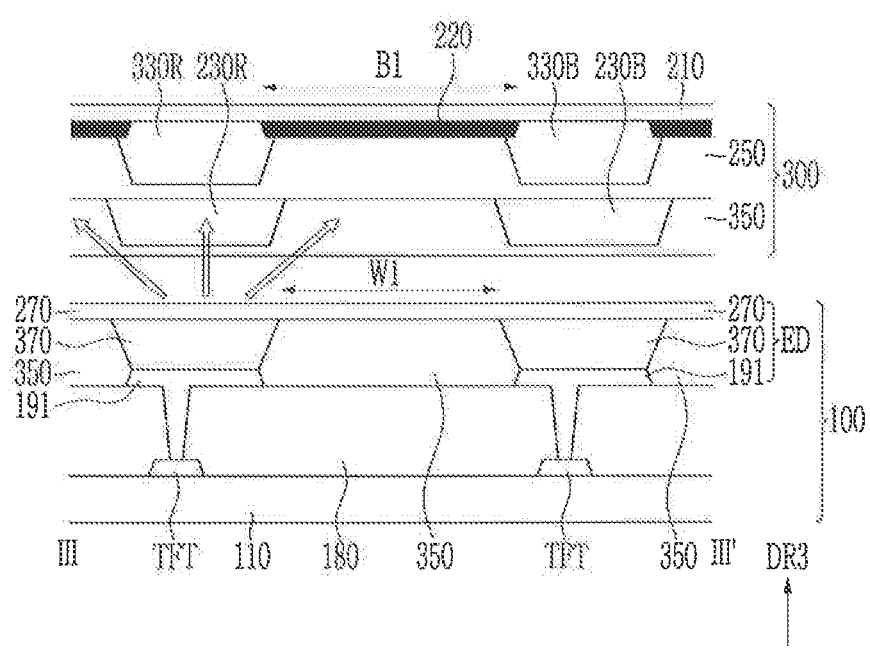
FIG. 3 shows a cross-sectional view taken along line III-III' of FIG. 1.

FIG. 3 shows a cross-sectional taken along line III-III' of FIG. 1.

Referring to FIGS. 1 and 3, regarding a cross-section passing through the gap P2 of the second color filter 230G, the length B1 of the light blocking member 220 and the length W1 of the partition wall 350 are longer than those of FIG. 2. Therefore, light emitted by one light-emitting device ED is not input to the color converting layer or the transmission layer of the neighboring pixel, thereby preventing the mixture of colors.

As shown in FIGS. 2 and 3, regarding the display device, the light emitting element layer 370, the color converting layers 330R and 330G, the transmission layer 330B, or the color filters 230R, 230G, and 230B overlap the first substrate 110 in the third direction DR3 (e.g., a vertical direction). Therefore, FIG. 1 shows a configuration in which the second color filter 230G is alternately disposed relative to the color filters 230R, 230G, and 230B, and the color converting layer 330G and the light emitting element layer 370 overlapping the second color filter 230G are alternately disposed with the neighboring color converting layer or the light emitting element layer 370.

The first color filter 230R may display red, the second color filter 230G may display green, and the third color filter 230B may display blue.

FIGS. 1 through 3 show a configuration in which the second color filter 230G is alternately arranged relative to the first color filter 230R and the third color filter 230B. However, the present invention is not limited thereto. For example, in an exemplary embodiment, the first color filter 230R may be alternately arranged relative to the second color filter 230G and the third color filter 230B, or the third color filter 230B may be alternately arranged relative to the first color filter 230R and the second color filter 230G.

A display device according to an exemplary embodiment of the present invention will now be described with reference to FIGS. 4 through 6.

Figure 4:
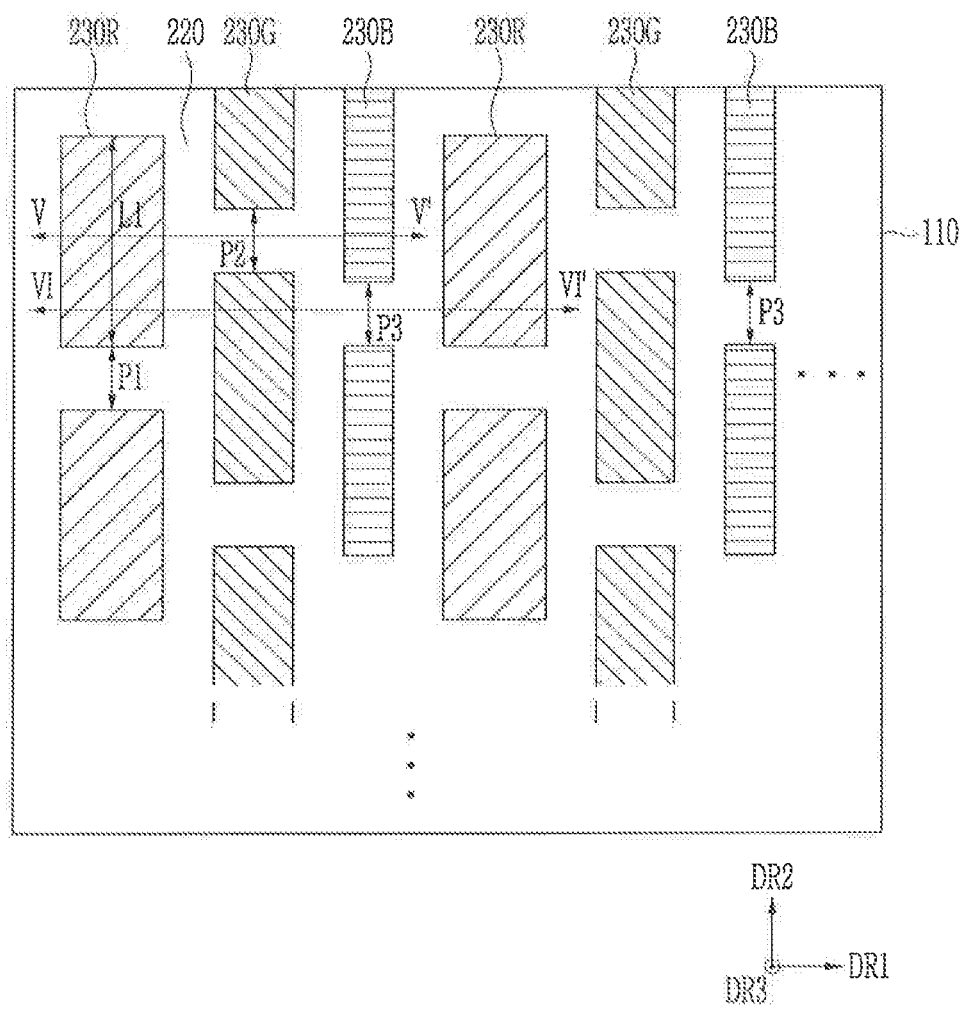
FIG. 4 shows a display device according to an exemplary embodiment of the present invention.

FIG. 4 shows a display device according to an exemplary embodiment of the present invention.

Figure 5:
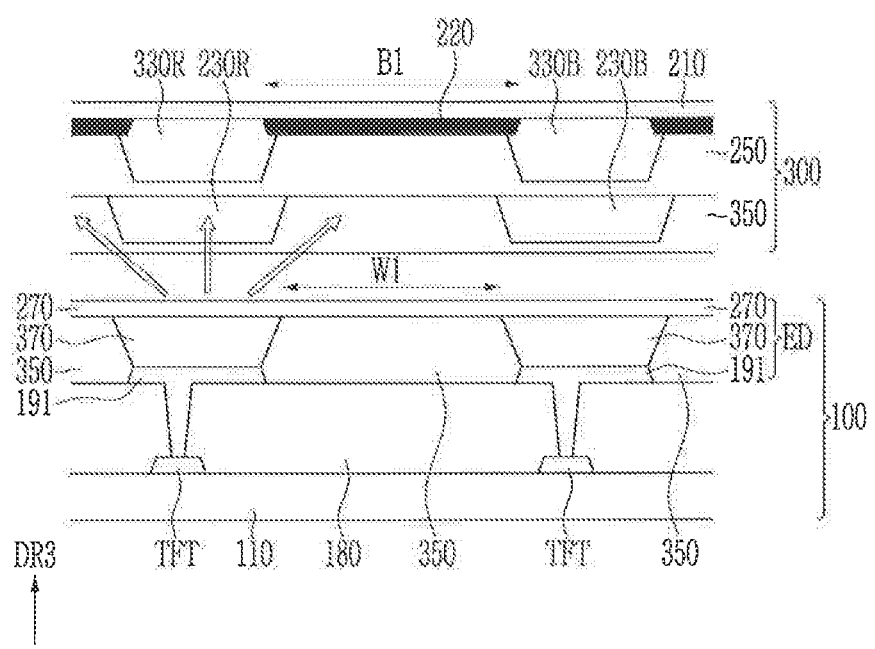
FIG. 5 shows a cross-sectional view taken along line V-V' of FIG. 4.
Figure 6:
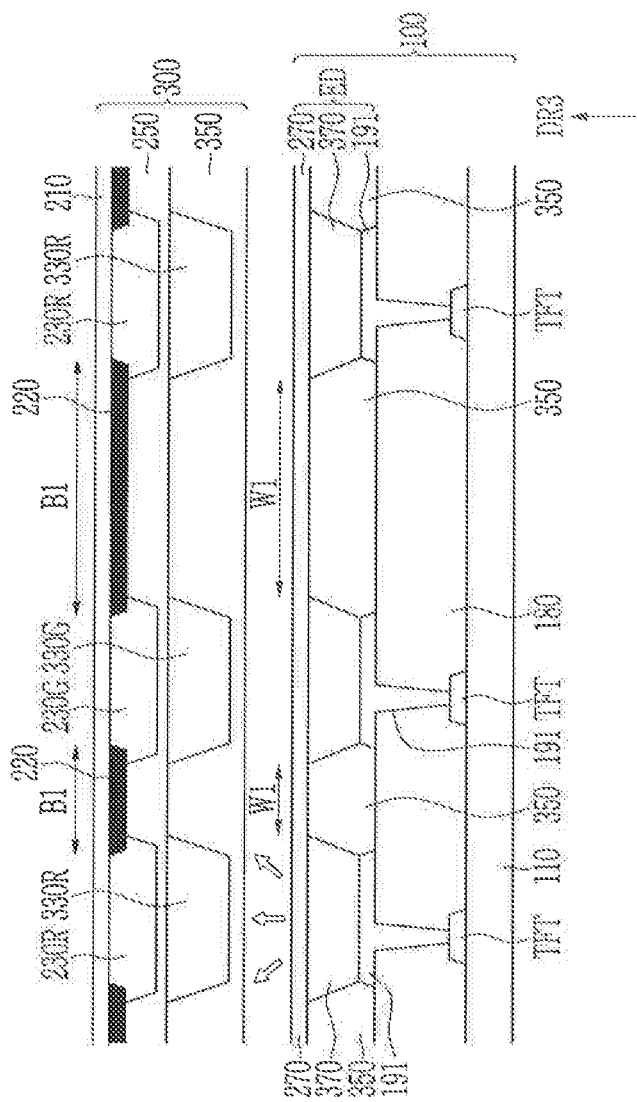
FIG. 6 shows a cross-sectional view taken along line VI-VI' of FIG. 4.

Referring to FIG. 4, the display device according to an exemplary embodiment to be described with reference to FIGS. 4 to 6 is substantially the same as the display device according to an exemplary embodiment described with reference to FIGS. 1 to 3, except that the first color filter 230R and the third color filter 230B are not aligned with each other in the first direction DR1. That is, unlike FIGS. 1 to 3, in an exemplary embodiment according to FIGS. 4 to 6, the first color filter 230R and the third color filter 230B are not aligned with each other in the first direction DR1. For convenience of explanation, a further description of elements and technical aspects previously described may be omitted.

In an exemplary embodiment according to FIGS. 1 to 3, the second color filter 230G is not aligned with the neighboring color filters in the first direction DR1. In an exemplary embodiment according to FIGS. 4 to 6, the first color filter 230R, the second color filter 230G, and the third color filter 230B are alternately arranged and are all staggered relative to each other. That is, none of the first color filter 230R, the second color filter 230G, and the third color filter 230B are aligned with each other in the first direction DR1.

Therefore, the first gap P1 of the first color filter 230R, the second gap P2 of the second color filter 230G, and the third gap P3 of the third color filter 230B do not overlap each other. In an exemplary embodiment, there is no overlap between the first gap P1, the second gap P2, and the third gap P3. In an exemplary embodiment, the first gap P1, the second gap P2, and the third gap P3 may partly overlap each other, but do not completely overlap each other.

Regarding a display device according to an exemplary embodiment described with reference to FIG. 4, a region in which the first color filter 230R, the second color filter 230G, and the third color filter 230B overlap in the first direction DR1 is small. For example, the region overlapping the second color filter 230G corresponds to a portion generated by subtracting the second gap P2 from the entire length L1 in the second direction DR2 of the first color filter 230R. Further, the region overlapping the third color filter 230B in the entire length L1 of the first color filter 230R corresponds to a portion generated by subtracting the third gap P3 from the entire length L1.

Hence, the region overlapping the neighboring color filter may be reduced, and as a result, the mixture of colors may be reduced.

For example, the region overlapping the first gap P2 of the second color filter 230G from among the first length L1 of the first color filter 230R may be about 10% to about 50%. This may be similar to the other color filters.

FIG. 5 shows a cross-sectional view taken along line V-V' of FIG. 4. Referring to FIGS. 4 and 5, a separation distance corresponding to the length B1 of the light blocking member 220 between the first color filter 230R and the third color filter 230B increases in the cross-section passing through the second gap P2. As a result, mixture of colors may be prevented or reduced.

FIG. 6 shows a cross-sectional view taken along line VI-VI' of FIG. 4. Referring to FIGS. 5 and 6, the separation distance corresponding to the length B1 of the light blocking member 220 between the first color filter 230R and the second color filter 230G increases in the region overlapping the third gap P3. As a result, mixture of colors may be prevented or reduced.

As described above, the display device according to an exemplary embodiment of the present invention has some or all of the color filters 230R, 230G, and 230B arranged such that they are not aligned with the neighboring color filter. As a result, the mixture of colors among neighboring pixels may be prevented or reduced.

As described above, the color filters 230R, 230G, and 230B overlap the color converting layers 330R and 330G or the transmission layer 330B and the light emitting element layer 370 in the third direction DR3. Therefore, when one color filter is arranged such that it is not aligned with the neighboring color filter, the color converting layers or the transmission layer 330B overlapping the color filter, and the light emitting element layer 370, may also be arranged such that they are not aligned with the neighboring pixel.

However, the pixels corresponding to the respective color filters 230R, 230G, and 230B may have an identical arrangement. That is, when the second color filter 230G is arranged such that it is not aligned with the neighboring color filter, the transistor corresponding to the second color filter 230G may be arranged such that it is aligned with the transistor of the other neighboring pixel.

Further, one pixel may include three transistors and one capacitor. This is, however, an example, and is not limited thereto.

A detailed pixel configuration of a display substrate 100 of a display device according to an exemplary embodiment of the present invention will now be described.

Figure 7:
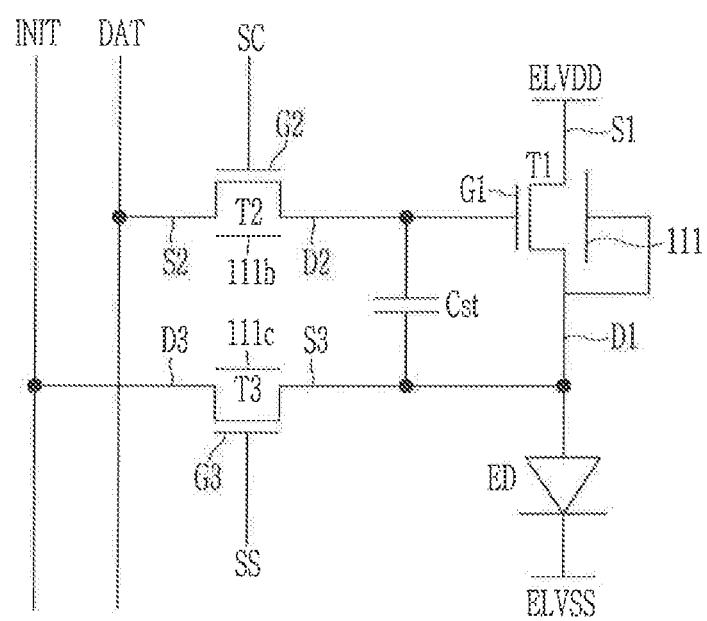
FIG. 7 shows a circuit diagram of one pixel of a display device according to an exemplary embodiment.

FIG. 7 shows a circuit diagram of one pixel of a display device according to an exemplary embodiment.

Referring to FIG. 7, the display device includes a plurality of pixels, and one pixel may include a plurality of transistors T1, T2, and T3, a capacitor Cst, and at least one light emitting diode (ED). The present exemplary embodiment will exemplify a case in which one pixel includes one light emitting device ED. The light emitting device ED may be, for example, a light emitting diode. Thus, the display device may be, for example, a light emitting diode display device such as an organic light emitting diode (OLED) display device.

The plurality of transistors T1, T2, and T3 include a first transistor T1, a second transistor T2, and a third transistor T3. A source electrode and a drain electrode to be described represent two electrodes disposed on respective sides of channels of the transistors T1, T2, and T3, and they are interchangeable.

The first transistor T1 includes a gate electrode G1 connected to a first end of the capacitor Cst, a source electrode S1 connected to a driving voltage line for transmitting a driving voltage ELVDD, and a drain electrode D1 connected to an anode of the light emitting device ED and a second end of the capacitor Cst. The first transistor T1 may receive a data voltage DAT according to a switching operation of the second transistor T2, and may supply a driving current to the light emitting device ED according to the voltage stored in the capacitor Cst.

The second transistor T2 includes a gate electrode G2 connected to a first scan line for transmitting a first scan signal SC, a source electrode S2 connected to a data line for transmitting the data voltage DAT or a reference voltage, and a drain electrode D2 connected to a first end of the capacitor Cst and the gate electrode G1 of the first transistor T1. The second transistor T2 may be turned on according to the first scan signal SC, and may transmit a reference voltage or the data voltage DAT to the gate electrode G1 of the first transistor T1 and the capacitor Cst.

The third transistor T3 includes a gate electrode G3 connected to a second scan line for transmitting a second scan signal SS, a source electrode S3 connected to the second end of the capacitor Cst, the drain electrode D1 of the first transistor T1, and the anode of the light emitting device ED, and a drain electrode D3 connected to an initialization voltage line for transmitting an initialization voltage INIT. The third transistor T3 may be turned on according to the second scan signal SS, and may transmit the initialization voltage INIT to the anode of the light emitting device ED and the second end of the capacitor Cst to initialize the voltage at the anode of the light emitting device ED.

The capacitor Cst includes a first end connected to the gate electrode G1 of the first transistor T1, and a second end connected to the source electrode S3 of the third transistor T3 and the anode of the light emitting device ED. The cathode of the light emitting device ED is connected to a common voltage line for transmitting a common voltage ELVSS.

The light emitting device ED may emit light according to the driving current formed by the first transistor T1.

An example of a circuit operation described with reference to FIG. 7, particularly an example of an operation for one frame, will now be described. Here, a case in which the transistors T1, T2, and T3 are n-type channel transistors will be exemplified, but the transistors T1, T2, and T3 are not limited thereto.

When one frame begins, a high-level first scan signal SC and a high-level second scan signal SS are supplied to turn on the second transistor T2 and the third transistor T3 for the initialization section. The reference voltage provided by the data line is supplied to the gate electrode G1 of the first transistor T1 and the first end of the capacitor Cst through the turned-on second transistor T2, and the initialization voltage INIT is supplied to the drain electrode D1 of the first transistor T1 and the anode of the light emitting device ED through the turned-on third transistor T3. Accordingly, the drain electrode D1 of the first transistor T1 and the anode of the light emitting device ED are initialized by the initialization voltage INIT for the initialization section. In this instance, a difference voltage between the reference voltage and the initialization voltage INIT is stored in the capacitor Cst.

In a sensing section, when the second scan signal SS becomes low-level while the high-level first scan signal SC is maintained, the second transistor T2 is maintained in the turned-on state and the third transistor T3 is turned off. The gate electrode G1 of the first transistor T1 and the first end of the capacitor Cst are maintained at the reference voltage through the turned-on second transistor T2, and the drain electrode D1 of the first transistor T1 and the anode of the light emitting device ED are disconnected from the initialization voltage INIT through the turned-off third transistor T3. Accordingly, the first transistor T1 is turned off when the current flows to the drain electrode D1 from the source electrode S1 and the voltage at the drain electrode D1 becomes "reference voltage-Vth". Vth represents a threshold voltage of the first transistor T1. In this instance, a voltage difference between the gate electrode G1 and the drain electrode D1 of the first transistor T1 is stored in the capacitor Cst, and sensing of the threshold voltage Vth of the first transistor T1 is finished. A characteristic deviation of the first transistor T1 that is variable for respective pixels may be externally compensated by generating a data signal that is compensated by applying characteristic information sensed for the sensing section.

When a high-level first scan signal SC is supplied and a low-level second scan signal SS is supplied for a data input section, the second transistor T2 is turned on and the third transistor T3 is turned off. The data voltage DAT provided from the data line is supplied to the gate electrode G1 of the first transistor T1 and the first end of the capacitor Cst through the turned-on second transistor T2. In this instance, the drain electrode D1 of the first transistor T1 and the anode of the light emitting device ED may maintain the potential of the sensing section by the turned-off first transistor T1.

For the emission section, the first transistor T1 that is turned on by the data voltage DAT transmitted to the gate electrode G1 generates a driving current caused by the data voltage DAT, and the light emitting device ED may emit light by the driving current.

Figure 8:
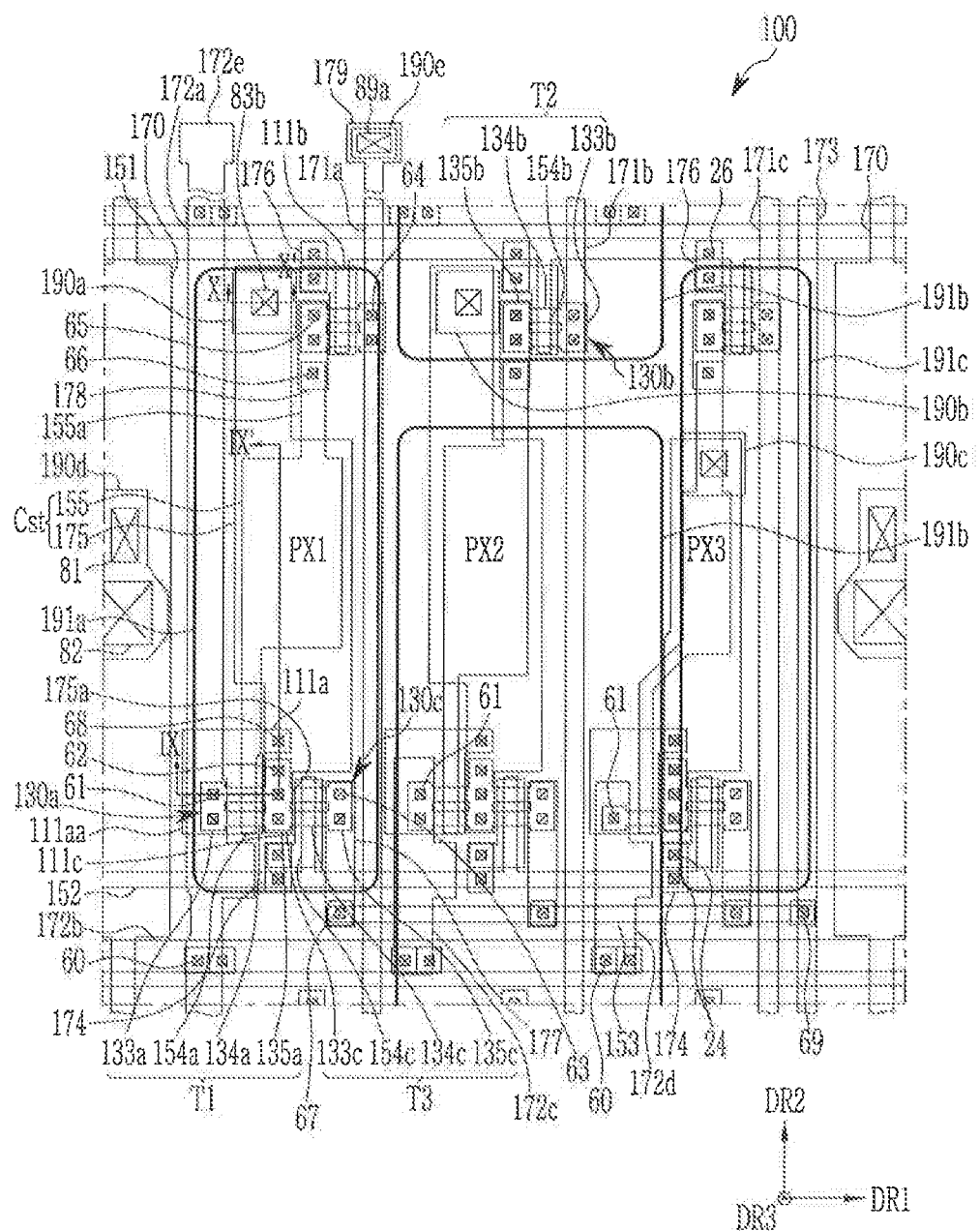
FIG. 8 shows a planar layout view of a plurality of pixels of a display substrate according to an exemplary embodiment.
Figure 9:
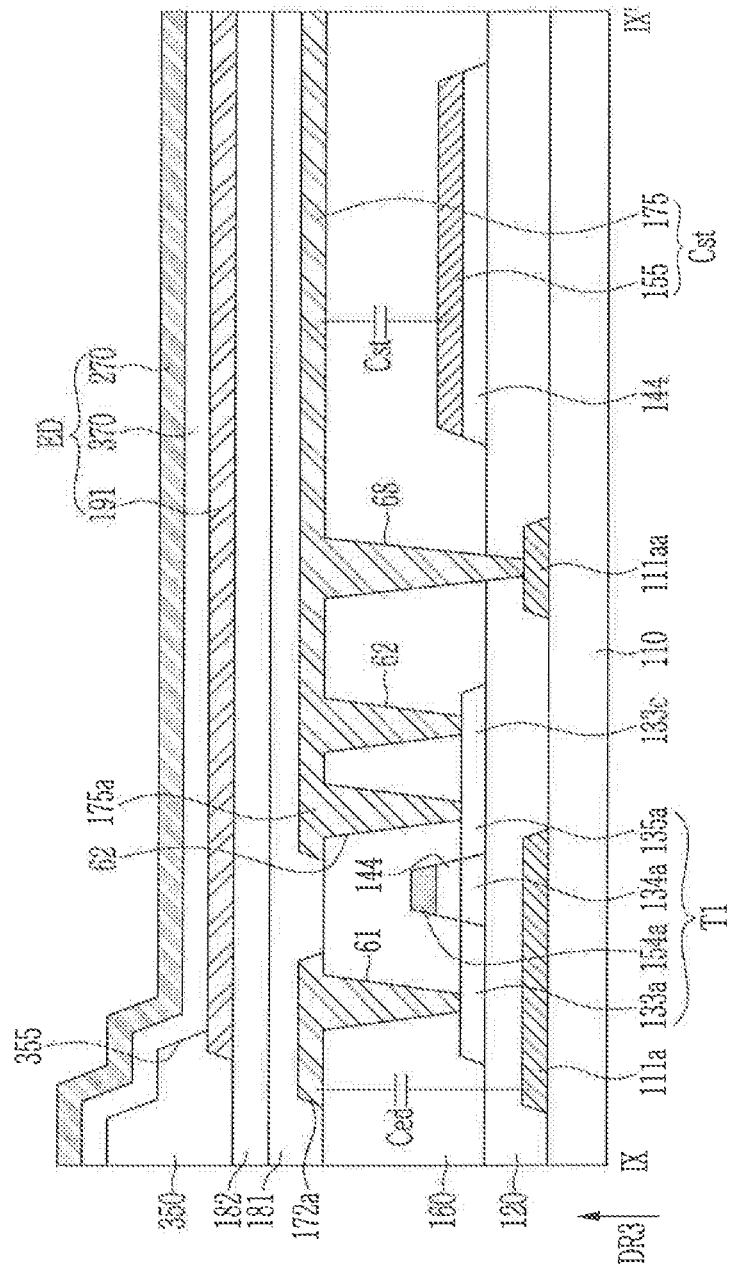
FIG. 9 shows a cross-sectional view of a display device shown in FIG. 8 taken along line IX-IX'.
Figure 10:
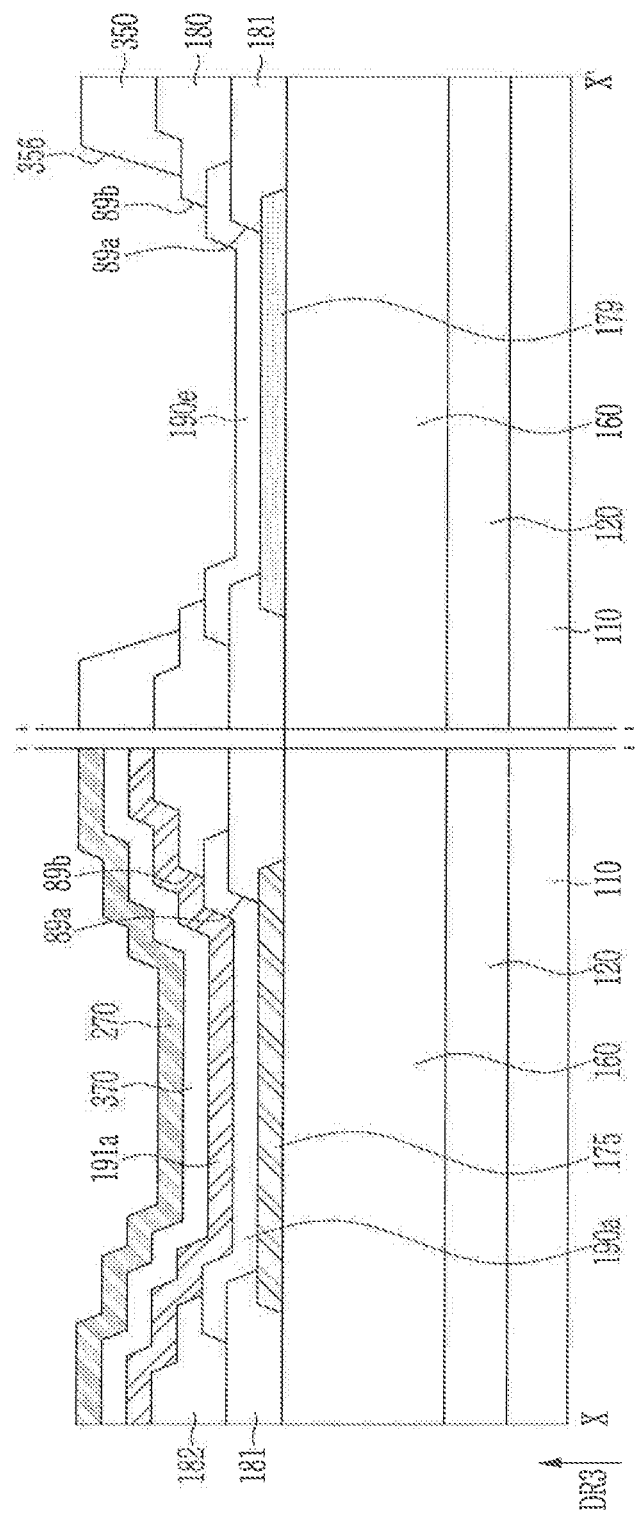
FIG. 10 shows a cross-sectional view of a display device shown in FIG. 8 taken along line X-X'.

FIG. 8 shows a planar layout view of a plurality of pixels PX1, PX2, and PX3 of a display substrate according to an exemplary embodiment. FIG. 9 shows a cross-sectional view of a display device shown in FIG. 8 taken along line IX-IX'. FIG. 10 shows a cross-sectional view of a display device shown in FIG. 8 taken along line X-X'.

Referring to FIGS. 8 to 10, the display substrate 100 may include a first substrate 110. The first substrate 110 may include an insulating material such as, for example, glass or plastic. The first substrate 110 may be flexible substrate.

A barrier layer that is an insulating layer may be disposed on the first substrate 110, and a lower layer including a plurality of lower patterns 111a, 111b, and 111c is provided thereon as a first conductive layer. The lower layer has conductivity, and may include various kinds of conductive metals or a semiconductor material with a conductive characteristic corresponding to them.

A buffer layer 120 that is an insulating layer is disposed on the lower layer. That is, the lower layer may be disposed between the first substrate 110 and the buffer layer 120.

An active layer including a plurality of active patterns 130a, 130b, and 130c is disposed on the buffer layer 120. That is, the lower layer may be disposed between the first substrate 110 and the active layer. The active patterns 130a, 130b, and 130c disposed on the respective pixels PX1, PX2, and PX3 may include channel regions 134a, 134b, and 134c for forming channels of the transistors T1, T2, and T3, and conductive regions connected thereto. The conductive regions of the active patterns 130a, 130b, and 130c include source regions 133a, 133b, and 133c and drain regions 135a, 135b, and 135c of the transistors T1, T2, and T3. The active pattern 130a may be connected to the active pattern 130c on the pixels PX1, PX2, and PX3. The active layer may include a semiconductor material such as, for example, amorphous silicon, polysilicon, or an oxide semiconductor.

An insulating pattern 144 that is a first insulating layer is disposed on the active layer. For example, the insulating pattern 144 may overlap the channel regions 134a, 134b, and 134c of the active patterns 130a, 130b, and 130c, and may be disposed on the channel regions 134a, 134b, and 134c. In an exemplary embodiment, the insulating pattern 144 does not substantially overlap the conductive regions of the active patterns 130a, 130b, and 130c.

A second conductive layer may be disposed on the insulating pattern 144. The second conductive layer may include a first scan line 151 for transmitting the first scan signal SC, a second scan line 152 for transmitting the second scan signal SS, a horizontal initialization voltage line 153 for transmitting the initialization voltage INIT, a horizontal driving voltage line 172b for transmitting the driving voltage ELVDD, a driving gate electrode 155, a second gate electrode 154b, and a third gate electrode 154c. The gate electrode G1, the gate electrode G2, and the gate electrode G3 in the above-described circuit diagram correspond to the first gate electrode 154a, the second gate electrode 154b, and the third gate electrode 154c.

The first and second scan lines 151 and 152, the horizontal initialization voltage line 153, and the horizontal driving voltage line 172b may extend in the first direction DR1. The driving gate electrode 155 may be disposed between the first scan line 151 and the second scan line 152. The second gate electrode 154b may be connected to the first scan line 151, and may protrude below the first scan line 151. The third gate electrode 154c may be connected to the second scan line 152, and may protrude above the second scan line 152.

The driving gate electrode 155 disposed on the pixels PX1, PX2, and PX3 may include an extension 155a protruding upward and substantially extending in the second direction DR2, and a first gate electrode 154a protruding downward and substantially extending in the second direction DR2. The first gate electrode 154a disposed on the pixel PX3 may be bent at least twice at a portion connected to the driving gate electrode 155.

The first gate electrode 154a traverses the active pattern 130a and overlaps the channel region 134a of the active pattern 130a. The second gate electrode 154b traverses the active pattern 130b and overlaps the channel region 134b of the active pattern 130b. The third gate electrode 154c traverses the active pattern 130c and overlaps the channel region 134c of the active pattern 130c.

A second insulating layer 160 may be disposed on the second conductive layer. The buffer layer 120 and/or the second insulating layer 160 may include a plurality of contact holes 24, 26, 60, 61, 62, 63, 64, 65, 66, 67, 68, and 69.

A third conductive layer may be disposed on the second insulating layer 160. The third conductive layer may include a plurality of data lines 171a, 171b, and 171c, a driving voltage line 172a, a common voltage line 170, an initialization voltage line 173, a capacitor electrode 175, a plurality of connecting members 174, 176, 177, and 178, and a plurality of driving voltage patterns 172c and 172d.

The data lines 171a, 171b, and 171c, the driving voltage line 172a, the common voltage line 170, the initialization voltage line 173, and the driving voltage patterns 172c and 172d may extend substantially in the second direction DR2 to traverse the first scan line 151 and/or the second scan line 152.

One group of a plurality of pixels PX1, PX2, and PX3 described with reference to FIG. 8 may be repeatedly arranged in the first direction DR1, and may be disposed adjacent to each other. The common voltage line 170 may be disposed on the respective sides of the one group of a plurality of pixels PX1, PX2, and PX3. That is, one common voltage line 170 may be provided for each repeated group of a plurality of pixels PX1, PX2, and PX3. When the repeated one group of a plurality of pixels PX1, PX2, and PX3 includes three pixels PX1, PX2, and PX3, three data lines 171a, 171b, and 171c, and at least one driving voltage line 172a, at least one initialization voltage line 173 may be disposed between two neighboring common voltage lines 170.

The respective data lines 171a, 171b, and 171c are electrically connected to the source region 133b of the active pattern 130b through at least one contact hole 64 (two contact holes 64 are shown for each of the pixels PX1, PX2, and PX3 in FIG. 8) of the second insulating layer 160.

FIG. 8 shows one data line 171a, and the respective data lines 171a, 171b, and 171c may include an end portion 179. The end portion 179 may be disposed in a pad region disposed on an edge of the display device.

The driving voltage line 172a may be disposed on one pixel, for example, the pixel PX1, and driving voltage patterns 172c and 172d may be disposed on the other pixels PX2 and PX3. The driving voltage line 172a may extend in the second direction DR2, and may extend near a plurality of pixels. In a like manner of the data line 171a, the driving voltage line 172a may include an end portion 172e disposed in the pad region.

The driving voltage line 172a and the driving voltage patterns 172c and 172d are electrically connected to the source region 133a of the active pattern 130a through at least one contact hole 61 (two contact holes 61 are shown in the pixels PX1 and PX2 and one contact hole 61 is shown in the pixel PX3 in FIG. 8) of the second insulating layer 160. The driving voltage line 172a and the driving voltage patterns 172c and 172d are electrically connected to the horizontal driving voltage line 172b through at least one contact hole 60 (two contact holes 60 are shown in one of the pixels PX1, PX2, and PX3 in FIG. 8) of the second insulating layer 160. Therefore, the horizontal driving voltage line 172b and the driving voltage patterns 172c and 172d may transmit the driving voltage ELVDD together with the driving voltage line 172a, and the driving voltage ELVDD may be transmitted in a mesh form in directions including the first direction DR1 and the second direction DR2 in the display device.

The initialization voltage line 173 is electrically connected to the horizontal initialization voltage line 153 through the contact hole 69 of the second insulating layer 160. Therefore, the horizontal initialization voltage line 153 may transmit the initialization voltage INIT together with the initialization voltage line 173. When one initialization voltage line 173 is formed for each group of the pixels PX1, PX2, and PX3, the initialization voltage INIT may be transmitted to the pixels PX1, PX2, and PX3 through the horizontal initialization voltage line 153.

The capacitor electrode 175 may be disposed on the respective pixels PX1, PX2, and PX3. The capacitor electrode 175 may overlap most of the driving gate electrode 155 that corresponds with the second insulating layer 160 therebetween, and may thus form a capacitor Cst.

The capacitor electrode 175 includes a connector 175a protruding downward. The connector 175a is electrically connected to the drain region 135a of the active pattern 130a and the source region 133c of the active pattern 130c connected thereto through at least one contact hole 62 (three contact holes 62 are shown in each of the pixels PX1, PX2, and PX3 in FIG. 8) of the second insulating layer 160. The capacitor electrode 175 is electrically connected to the lower pattern 111a through the contact hole 68 of the second insulating layer 160 and the buffer layer 120.

The connecting member 174 is electrically connected to the second scan line 152 and the lower pattern 111c through two contact holes 24 of the buffer layer 120 and the second insulating layer 160 or the second insulating layer 160, and may electrically connect the second scan line 152 and the lower pattern 111c.

The connecting member 176 is electrically connected to the first scan line 151 and the lower pattern 111b through two contact holes 26 of the buffer layer 120 and the second insulating layer 160 or the second insulating layer 160, and may electrically connect the first scan line 151 and the lower pattern 111b.

The connecting member 177 is electrically connected to the drain region 135c of the active pattern 130c through at least one contact hole 63 (two contact holes 63 are shown in one of the pixels PX1, PX2, and PX3 in FIG. 8) of the second insulating layer 160 on the respective pixels PX1, PX2, and PX3, and is electrically connected to the horizontal initialization voltage line 153 through the contact hole 67 of the second insulating layer 160. As a result, the drain region 135c of the active pattern 130c may be electrically connected to the horizontal initialization voltage line 153.

The horizontal initialization voltage line 153 extends in the first direction DR1 over the three adjacent pixels PX1, PX2, and PX3, and may be disposed between two adjacent common voltage lines 170 and may not traverse the two common voltage lines 170. The horizontal initialization voltage line 153 may traverse three neighboring data lines 171a, 171b, and 171c, and may extend up to the initialization voltage line 173.

The connecting member 178 is electrically connected to the drain region 135b of the active pattern 130b through at least one contact hole 65 (two contact holes 65 are shown in one of the pixels PX1, PX2, and PX3 in FIG. 8) of the second insulating layer 160 on the respective pixels PX1, PX2, and PX3, and is electrically connected to the extension 155a of the driving gate electrode 155 through the contact hole 66 of the second insulating layer 160. As a result, the drain region 135b of the active pattern 130b may be electrically connected to the extension 155a of the driving gate electrode 155.

At least one of the first conductive layer, the second conductive layer, and the third conductive layer may include, for example, at least one of metals including copper (Cu), aluminum (Al), magnesium (Mg), silver (Ag), gold (Au), platinum (Pt), palladium (Pd), nickel (Ni), neodymium (Nd), iridium (Jr), molybdenum (Mo), tungsten (W), titanium (Ti), chromium (Cr), tantalum (Ta), and an alloy thereof. The first conductive layer, the second conductive layer, and the third conductive layer may respectively include a single layer or may be a multilayer.

For example, the third conductive layer may have a multilayered structure including a lower layer including titanium and an upper layer including copper.

The first transistor T1 includes a channel region 134a, a source region 133a, a drain region 135a, and a first gate electrode 154a. The source region 133a of the first transistor T1 is electrically connected to the driving voltage line 172a and the driving voltage patterns 172c and 172d so it may receive the driving voltage ELVDD.

The lower pattern 111a corresponding to the first transistor T1 overlaps the channel region 134a between the channel region 134a of the first transistor T1 and the first substrate 110 to prevent external light from reaching the channel region 134a, and thereby reduces a leakage current and characteristic deterioration. The lower pattern 111a is electrically connected to the drain region 135a of the first transistor T1 through the capacitor electrode 175.

The second transistor T2 includes a channel region 134b, a source region 133b, a drain region 135b, and a second gate electrode 154b. The source region 133b of the second transistor T2 may be electrically connected to the data lines 171a, 171b, and 171c to receive the data voltage DAT or the reference voltage. The drain region 135b of the second transistor T2 may be electrically connected to the first gate electrode 154a through the driving gate electrode 155.

The lower pattern 111b corresponding to the second transistor T2 overlaps the channel region 134b between the channel region 134b of the second transistor T2 and the first substrate 110 to prevent external light from reaching the channel region 134b, and thereby reduces a leakage current and characteristic deterioration. The lower pattern 111b is electrically connected to the first scan line 151 to form a dual gate electrode of the second transistor T2 with the second gate electrode 154b.

The third transistor T3 includes a channel region 134c, a source region 133c, a drain region 135c, and a third gate electrode 154c. The drain region 135c of the third transistor T3 may receive the initialization voltage INIT from the horizontal initialization voltage line 153. The lower pattern 111c corresponding to the third transistor T3 overlaps the channel region 134c between the channel region 134c of the third transistor T3 and the first substrate 110 to prevent external light from reaching the channel region 134c, and thereby reduces a leakage current and characteristic deterioration. The lower pattern 111c is electrically connected to the second scan line 152, and may form a dual gate electrode of the third transistor T3 with the third gate electrode 154c.

A third insulating layer 181 may be disposed on the second insulating layer 160 and the third conductive layer. The third insulating layer 181 may include a contact hole 83a disposed in the capacitor electrode 175, a contact hole 89a disposed in an end portion 179 of the data lines 171a, 171b, and 171c, and a contact hole 81 disposed on the common voltage line 170. A fourth conductive layer including a plurality of contact members 190a, 190b, 190c, 190d, and 190e may be disposed on the third insulating layer 181.

The respective contact members 190a, 190b, and 190c may be disposed on the pixels PX1, PX2, and PX3, may contact the capacitor electrode 175 through the contact hole 83a, and may be electrically connected. The contact member 190d may contact the common voltage line 170 through the contact hole 81 and may be electrically connected thereto. The contact member 190e may contact an end portion 179 of the data lines 171a, 171b, and 171c through the contact hole 89a and may be electrically connected thereto.

The contact members 190a, 190b, 190c, 190d, and 190e may improve adherence of the capacitor electrode 175 of the third conductive layer, the common voltage line 170, and an end portion 179 of the data lines 171a, 171b, and 171c contacting the same with another conductive layer, and may prevent the third conductive layer from being oxidized. For example, when the upper layer of the third conductive layer includes copper, the copper may be prevented from being oxidized. For this, when the upper layer of the third conductive layer includes a conductive material for preventing corrosion, for example, when it includes copper, the fourth conductive layer may include a conductive material for capping the upper layer of the third conductive layer and preventing corrosion of the copper. For example, the fourth conductive layer may include a conductive material such as a metal oxide (e.g., ITO or IZO).

A fourth insulating layer 182 may be disposed on the third insulating layer 181 and the fourth conductive layer. The fourth insulating layer 182 may include a contact hole 83b disposed in the contact members 190a, 190b, and 190c and overlapping the contact hole 83a, and a contact hole 89b disposed in the contact member 190e and overlapping the contact hole 89a. A fifth insulating layer, which may correspond to the partition wall 350, disposed on the fourth insulating layer 182 may include an opening 356 corresponding to the contact hole 89b.

The contact member 190e may be exposed to the outside by the contact hole 89b, and may be electrically connected to an additional driving circuit chip, a circuit film, or a circuit board.

At least one of the buffer layer 120, the first insulating layer (the insulating pattern 144), the second insulating layer 160, the third insulating layer 181, and the fourth insulating layer 182 may include an inorganic insulating material and/or an organic insulating material such as, for example, a silicon nitride (SiNx), a silicon oxide (SiOx), or a silicon oxynitride (SiON). For example, the fourth insulating layer 182 may include an inorganic insulating material and/or an organic insulating material such as a polyimide, an acryl-based polymer, or a siloxane-based polymer, and may have a substantially planar top side.

A pixel electrode layer including a plurality of pixel electrodes 191a, 191b, and 191c as a fifth conductive layer may be disposed on the fourth insulating layer 182. The respective pixel electrodes may include a first pixel electrode 191a, a second pixel electrode 191b, and a third pixel electrode 191c. The respective pixel electrodes 191a, 191b, and 191c may be disposed corresponding to the respective pixels PX1, PX2, and PX3 as shown in FIG. 8. The respective pixels include a first pixel PX1, a second pixel PX2, and a third pixel PX3.

Sizes and shapes of the first pixel electrode 191a, the second pixel electrode 191b, and the third pixel electrode 191c in a plan view may be different from each other.

For example, regarding the three pixels PX1, PX2, and PX3, the sizes in a plan view may reduce in order of the second pixel electrode 191b, the first pixel electrode 191a, and the third pixel electrode 191c. In this case, the second pixel PX2 may display green, the first pixel PX1 may display red, and the third pixel PX3 may display blue.

In an exemplary embodiment, the size of the first pixel electrode 191a in a plan view may be the greatest, and the subsequent sizes may reduce in order of the second pixel electrode 191b and the third pixel electrode 191c.

Further, as shown in FIG. 8, the second pixel electrode 191b corresponding to the second pixel PX2 may not be aligned with the neighboring pixel electrodes 191a and 191c. For example, respective edges of the second pixel electrode 191b in the second direction DR2 may not be aligned with respective edges of the neighboring pixel electrodes 191a and 191c in the second direction DR2. An alternate disposal of the second pixel electrode 191b corresponds to that described with reference to FIG. 1. That is, the second color filter 230G is arranged such that it is not aligned with the neighboring color filter in FIG. 1, and the second pixel electrode 191b is arranged in a like manner.

FIG. 8 shows a configuration in which the second pixel electrode 191b is alternately arranged with the pixel electrode as shown in FIG. 1. In a display device according to an exemplary embodiment, for example, as shown in FIG. 4, the second pixel electrode 191b and the third pixel electrode 191c may be alternately disposed with the neighboring pixel electrode.

The respective pixel electrodes 191a, 191b, and 191c may contact the respective contact members 190a, 190b, and 190c through the contact hole 83b, and may be electrically connected to the capacitor electrode 175 through the contact members 190a, 190b, and 190c. Therefore, the respective pixel electrodes 191a, 191b, and 191c may be electrically connected to the drain region 135a of the first transistor T1 to receive a voltage from the first transistor T1.

The pixel electrode layer may include, for example, a semi-transparent conductive material or a reflective conductive material.

A fifth insulating layer (the partition wall 350) may be disposed on the fourth insulating layer 182. The fifth insulating layer (the partition wall 350) includes an opening 355 disposed in the pixel electrodes 191a, 191b, and 191c. The fifth insulating layer (the partition wall 350) may include an organic insulating material such as, for example, a polyacryl-based resin or a polyimide-based resin.

An emission layer, which may correspond to the light emitting element layer 370, is disposed on the fifth insulating layer (the partition wall 350) and the pixel electrode layer. The emission layer (the light emitting element layer 370) may include a portion disposed in the opening 355 of the fifth insulating layer (the partition wall 350). The emission layer (the light emitting element layer 370) may include, for example, an organic emitting material or an inorganic emitting material. In an exemplary embodiment, at least part of the top of the fifth insulating layer (the partition wall 350) is not covered by the emission layer (the light emitting element layer 370).

The emission layer (the light emitting element layer 370) may overlap the respective pixel electrode layers 191a, 191b, and 191c. Therefore, the emission layers 370 of the pixels PX1, PX2, and PX3 may be alternately disposed with each other. For example, the emission layer (the light emitting element layer 370) of the second pixel PX2 may not be aligned with the emission layer of the neighboring pixels PX1 and PX3. That is, the emission layer (the light emitting element layer 370) of the respective pixels PX1, PX2, and PX3 may have a similar arrangement to the color filters 230R, 230G, and 230B shown in FIG. 1, or may have a similar arrangement to the color filters 230R, 230G, and 230B shown in FIG. 4.

The fifth insulating layer (the partition wall 350) and the emission layer (the light emitting element layer 370) may include a contact hole 82 disposed in the contact member 190d.

A common electrode, which may correspond to the second electrode 270 described above, is disposed on the emission layer (the light emitting element layer 370). The common electrode (second electrode 270) may be continuously formed throughout the plurality of pixels PX1, PX2, and PX3. The common electrode (second electrode 270) may contact the contact member 190d through the contact hole 82, may be electrically connected to the common voltage line 170, and may receive the common voltage ELVSS.

The common electrode (second electrode 270) may include a transparent conductive material.

The pixel electrodes 191a, 191b, and 191c, the emission layer (the light emitting element layer 370), and the common electrode (second electrode 270) of the pixel PX1, PX2, and PX3 configure a light emitting device ED, and one of the pixel electrodes 191a, 191b, and 191c, and the common electrode (second electrode 270) becomes a cathode and the other becomes an anode. The case in which the pixel electrode 191a, 191b, and 191c become an anode has been described.

Referring to FIG. 8, the lower pattern 111a may further include an extension 111aa overlapping the driving voltage line 172a and the driving voltage patterns 172c and 172d in a plan view. Accordingly, the size of the lower pattern 111a in a plan view may be greater than the size of the lower pattern 111b or the lower pattern 111c in a plan view. According to an exemplary embodiment, the lower pattern 111a is electrically connected to the pixel electrodes 191a, 191b, and 191c that are anodes through the capacitor electrode 175, and the extension 111aa of the lower pattern 111a overlaps the driving voltage line 172a and the driving voltage patterns 172c and 172d for transmitting a predetermined voltage with the buffer layer 120 and the second insulating layer 160 therebetween. As a result, the capacitor (Ced) for reinforcing the function for maintaining the voltage at the anode may be formed.

The extension 111aa may overlap the source region 133a of the active pattern 130a connected to the driving voltage line 172a.

The lower pattern 111a is electrically connected to the pixel electrodes 191a, 191b, and 191c through the capacitor electrode 175 and overlaps the channel region 134a of the first transistor T1. As a result, a current change rate is reduced in a saturation region in a voltage-current characteristic graph of the first transistor T1, and an output current of the first transistor T1 may increase to a predetermined range. Therefore, when a voltage Vds between the source and the drain of the first transistor T1 changes, an output current of the first transistor T1 is constant. As a result, an output saturation characteristic may be improved. According to exemplary embodiments, luminance deviation among pixels caused by the output current of the first transistor T1 may be reduced and image quality may be increased.

The color converting substrate 300 shown in FIGS. 2, 3, 5, and 6 may overlap the display substrate 100. The color filters 230R, 230G, and 230B and the color converting layer 330R and 330G or the transmission layer 330B on the color converting substrate 300 may overlap the pixel electrode layers 191a, 191b, and 191c.

While the present invention has been particularly shown and described with reference to the exemplary embodiments thereof, it will be understood by those of ordinary skill in the art that various changes in form and detail may be made therein without departing from the spirit and scope of the present invention as defined by the following claims.

What is claimed is:

1. A display device, comprising:
a substrate comprising a plurality of light-emitting devices;
a first color filter, a second color filter, and a third color filter that overlap one of the light-emitting devices; and
a first color converting layer that overlaps the first color filter, a second color converting layer that overlaps the second color filter, and a transmission layer that overlaps the third color filter,
wherein a plurality of the first color filters, a plurality of the second color filters, and a plurality of the third color filters are arranged in a first direction, and
a gap between adjacent second color filters in a second direction overlaps the first color filter in the first direction.

2. The display device of claim 1, wherein
in the first direction, a gap between adjacent first color filters in the second direction overlaps a gap between adjacent third color filters in the second direction.

3. The display device of claim 1, wherein
the first color filter is a red color filter,
the second color filter is a green color filter, and
the third color filter is a blue color filter.

4. The display device of claim 1, wherein
the one of the light-emitting devices corresponds to one pixel, and
the one pixel comprises three transistors and one capacitor.

5. The display device of claim 1, wherein
the plurality of light-emitting devices emit blue light.

6. The display device of claim 1, wherein
a region of the first color filter overlapping the gap between adjacent second color filters in the second direction is about 10% to about 50% of a length of the overlapping first color filter in the second direction.

7. The display device of claim 1, wherein
the second color filter overlaps a light emitting element layer and the second color converting layer in a direction perpendicular to the substrate.

8. The display device of claim 1, wherein
an area of the first color filter is greater than an area of the second color filter, and
the area of the second color filter is greater than an area of the third color filter.

9. The display device of claim 1, wherein
an area of the second color filter is greater than an area of the first color filter, and
the area of the first color filter is greater than an area of the third color filter.

10. A display device, comprising:
a substrate comprising a plurality of light-emitting devices;
a first color filter, a second color filter, and a third color filter that overlap one of the light-emitting devices; and
a first color converting layer that overlaps the first color filter, a second color converting layer that overlaps the second color filter, and a transmission layer that overlaps the third color filter,
wherein a plurality of the first color filters, a plurality of the second color filters, and a plurality of the third color filters are arranged in a first direction,
a gap between adjacent second color filters in a second direction overlaps the first color filter and the third color filter in the first direction,
a gap between adjacent third color filters in the second direction overlaps the first color filter and the second color filter in the first direction, and
a gap between adjacent first color filters in the second direction overlaps the second color filter and the third color filter in the first direction.

11. The display device of claim 10, wherein
the first color filter is a red color filter,
the second color filter is a green color filter, and
the third color filter is a blue color filter.

12. The display device of claim 10, wherein
the one of the light-emitting devices corresponds to one pixel, and
the one pixel comprises three transistors and one capacitor.

13. The display device of claim 10, wherein
the plurality of light-emitting devices emit blue light.

14. The display device of claim 10, wherein
a region of the first color filter overlapping the gap between adjacent second color filters in the second direction is about 10% to about 50% of a length of the overlapping first color filter in the second direction.

15. The display device of claim 10, wherein
a region of the first color filter overlapping the gap between adjacent third color filters in the second direction is about 10% to about 50% of a length of the overlapping first color filter in the second direction.

16. The display device of claim 10, wherein
the first color filter overlaps a light emitting element layer and the first color converting layer in a direction perpendicular to the substrate,
the second color filter overlaps the light emitting element layer and the second color converting layer in the direction perpendicular to the substrate, and
the third color filter overlaps the light emitting element layer and the transmission layer in the direction perpendicular to the substrate.

17. The display device of claim 10, wherein
an area of the first color filter is greater than an area of the second color filter, and
the area of the second color filter is greater than an area of the third color filter.

18. The display device of claim 10, wherein
an area of the second color filter is greater than an area of the first color filter, and
the area of the first color filter is greater than a area of the third color filter.

* * * * *